(12) United States Patent
Suganaga

(10) Patent No.: US 6,717,652 B2
(45) Date of Patent: Apr. 6, 2004

(54) EXPOSURE APPARATUS, EXPOSURE METHOD AND SEMICONDUCTOR DEVICE FABRICATED WITH THE EXPOSURE METHOD

(75) Inventor: Toshifumi Suganaga, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 199 days.

(21) Appl. No.: 09/820,841

(22) Filed: Mar. 30, 2001

(65) Prior Publication Data

US 2002/0072000 A1 Jun. 13, 2002

(30) Foreign Application Priority Data

Oct. 24, 2000 (JP) ......................... 2000-323970

(51) Int. Cl.[7] ................. G03B 27/74; G03B 27/42; G03B 27/72
(52) U.S. Cl. ............... 355/68; 355/53; 355/67; 355/69; 250/205
(58) Field of Search ................ 355/53, 67, 68, 355/69, 70, 71; 430/30; 250/200, 201.1, 205

(56) References Cited

U.S. PATENT DOCUMENTS

| | | | | |
|---|---|---|---|---|
| 5,329,336 A | * | 7/1994 | Hirano et al. | 355/53 |
| 5,861,944 A | * | 1/1999 | Nishi | 355/68 |
| 5,892,573 A | * | 4/1999 | Takahashi et al. | 355/61 |
| 5,925,887 A | * | 7/1999 | Sakai et al. | 250/548 |
| 6,115,107 A | * | 9/2000 | Nishi | 355/68 |
| 6,337,734 B1 | * | 1/2002 | Mori | 355/69 |

FOREIGN PATENT DOCUMENTS

| | | |
|---|---|---|
| JP | 9-283407 | 10/1997 |
| JP | 11-160887 | 6/1999 |

* cited by examiner

Primary Examiner—Alan Mathews
(74) Attorney, Agent, or Firm—McDermott, Will & Emery

(57) ABSTRACT

An exposure apparatus and an exposure method according to the present invention comprise an average illuminance operation unit for averaging illuminance values obtained from four illuminance meters provided on a stage and obtaining average illuminance and a light exposure control unit controlling a light exposure on the basis of information obtained from the average illuminance operation unit. Thus, an exposure apparatus and an exposure method capable of correctly managing the light exposure can be provided.

5 Claims, 8 Drawing Sheets

EXPOSURE APPARATUS, EXPOSURE METHOD AND SEMICONDUCTOR DEVICE FABRICATED WITH THE EXPOSURE METHOD

BACKGROUND OF THE INVENTION

1. Field of the Invention

The present invention relates to an exposure apparatus and an exposure method employed for pattern exposure on a resist film, and more specifically, it relates to an exposure apparatus and an exposure method capable of correctly managing a light exposure.

2. Description of the Prior Art

A photolithographic process consists of an application step, an exposure step and a development step for a resist film. Among these steps, the exposure step is carried out for transferring a pattern image formed on a reticle to a resist film provided on a wafer. In general, a reduced projection exposure system is employed in the exposure step.

The structure of an exposure apparatus employing the reduced projection exposure system is schematically illustrated with reference to FIG. 8. This exposure apparatus comprises a light source 102 emitting an exposure beam 100A, a reflecting mirror 104 reflecting the exposure beam 100A emitted from the light source 102, a beam shaping optical system 106 converting the exposure beam 100A to an exposure beam of a prescribed component, fly-eye lenses 108 and 112 for uniformly illuminating an exposure range, a condenser lens 118 illuminating the overall areas of the reflecting mirror 106, another reflecting mirror 116 and a reticle 120, a reduced projection lens 122 for reducing the pattern of the exposure beam passing through the reticle 120 and projecting the exposure beam to a wafer 124 placed on a stage 126 and a control unit 200 for controlling the light exposure time etc. of the light source 102, the position of the stage 126, information obtained from an illuminance meter 130A described later and other elements of the exposure apparatus.

In the exposure step of forming a pattern on a resist film, the light exposure is generally corrected by providing the illuminance meter 130A on the stage 126 located on the emission side of the reduced projection lens 122 for previously measuring illuminance with the illuminance meter 130A before the exposure step and controlling the light exposure time so that an integrated light exposure (product of the illuminance and the exposure time) in the exposure step is regularly constant on the basis of the obtained illuminance, as shown in FIG. 10. In a step-and-repeat batch exposure method, for example, the exposure time is decided on the basis of the obtained illuminance for controlling the integrated light exposure. In a scan exposure system, the moving speed of the stage 126 is calculated on the basis of the obtained illuminance for controlling the integrated light exposure.

In the aforementioned method of correcting the light exposure, however, the illuminance meter 130A provided on the emission side of the reduced projection lens 122 of the exposure apparatus must be periodically calibrated with another illuminance meter having normal sensitivity, in order to confirm deterioration of sensitivity of or abnormality of the illuminance meter 130A provided on the exposure apparatus.

As the wavelength of the exposure beam employed for the exposure step is reduced, further, illuminance on the emission side of the reduced projection lens 122 is remarkably reduced due to a blur of the reduced projection lens 122 (reduction of transmittance of the reduced projection lens 122 resulting from solarization) along with progress of the number of applied pulses (exposure time) with the reduced projection lens 122, as shown in FIG. 10.

When the exposure apparatus carries out no exposure step for a prescribed time, the surface of the reduced projection lens 122 is so contaminated by organic matter and inorganic matter that the illuminance is disadvantageously reduced on the emission side of the reduced projection lens 122.

SUMMARY OF THE INVENTION

A first object of the present invention is to provide an exposure apparatus capable of reducing the number of times of calibration of an illuminance meter provided on the emission side of a reduced projection lens of the exposure apparatus, an exposure method and a semiconductor device fabricated with the exposure method.

A second object of the present invention is to provide an exposure apparatus capable of properly setting a light exposure in consideration of a blur of a reduced projection lens, an exposure method and a semiconductor device fabricated with the exposure method.

A third object of the present invention is to provide an exposure apparatus capable of preventing reduction of illuminance resulting from contamination of the surface of a reduced projection lens by organic matter and inorganic matter.

According to an aspect of the present invention, an exposure apparatus setting a prescribed light exposure in exposure for forming a resist pattern with an optical system comprises at least two illuminance meters provided on the emission side of the aforementioned optical system, an average illuminance operation unit operating average illuminance on the basis of measured illuminance values obtained from the aforementioned illuminance meters, and a light exposure control unit controlling the light exposure on the basis of information obtained from the aforementioned average illuminance operation unit.

According to another aspect of the present invention, an exposure method setting a prescribed light exposure in exposure for forming a resist pattern with an optical system comprises an average illuminance operating step of operating average illuminance on the basis of measured illuminance values obtained from at least two illuminance meters provided on the emission side of the aforementioned optical system and a light exposure control step of controlling the light exposure on the basis of information obtained from the aforementioned average illuminance operating step.

According to the aforementioned exposure apparatus and the aforementioned exposure method, the illuminance meters are so provided in plural that dispersion of measured values or the like is averaged and measurement accuracy for the illuminance can be improved.

In the aforementioned exposure apparatus, the aforementioned average illuminance operation unit preferably includes a unit obtaining the average illuminance with remaining measured illuminance values except those of measured illuminance values exceeding a prescribed threshold in illuminance measurement.

In the aforementioned exposure method, the aforementioned average illuminance operating step preferably includes a step of obtaining the average illuminance with remaining measured illuminance values except those of measured illuminance values exceeding a prescribed threshold in illuminance measurement.

When the prescribed threshold is provided for the measured values for obtaining the average illuminance except the measured values exceeding the threshold, deterioration or abnormal values of the illuminance meters can be omitted so that the number of times of calibration of the illuminance meters provided on the emission side of the reduced projection lens of the exposure apparatus can be reduced as compared with the conventional exposure apparatus.

According to still another aspect of the present invention, an exposure apparatus setting a prescribed light exposure in exposure for forming a resist pattern comprises an illuminance measuring unit performing illuminance measurement before exposing an (N–1)th (N: integer) wafer, illuminance measurement after exposing the (N–1)th wafer and illuminance measurement during at least single exposure of the (N–1)th wafer and a light exposure decision unit deciding illuminance for an N-th wafer from measurement results obtained from the aforementioned illuminance measuring unit for deciding the light exposure for exposing the N-th wafer.

According to a further aspect of the present invention, an exposure method setting a prescribed light exposure in exposure for forming a resist pattern comprises an illuminance measuring step of performing illuminance measurement before exposing an (N–1)th (N: integer) wafer, illuminance measurement after exposing the (N–1)th wafer and illuminance measurement during at least single exposure of the (N–1)th wafer and a light exposure decision step of deciding illuminance for an N-th wafer from measurement results obtained from the aforementioned illuminance measuring step for deciding the light exposure for exposing the N-th wafer.

According to the aforementioned exposure apparatus and the aforementioned exposure method, the exposure time can be correctly set with high precision by deciding the exposure time every shot, also when illuminance on the emission side of the reduced projection lens is reduced following progress of the exposure time of the reduced projection lens due to a blur of the reduced projection lens (reduction of transmittance of the reduced projection lens resulting from solarization) as the wavelength employed for exposure is reduced, dissimilarly to the prior art.

In the aforementioned exposure apparatus, the aforementioned light exposure decision unit preferably includes a relational expression operation unit obtaining a relational expression of illuminance and an exposure time from illuminance measurement results obtained from the aforementioned illuminance measuring unit and a first illuminance operation unit obtaining illuminance at the time of starting exposure of the N-th wafer and illuminance at the time of ending the exposure from the relational expression obtained by the aforementioned relational expression operation unit.

In the aforementioned exposure apparatus, the N-th wafer is further preferably provided with a plurality of shot areas, and the aforementioned light exposure decision unit preferably further includes a second illuminance operation unit obtaining illuminance every shot of the N-th wafer and an exposure time operation unit obtaining an exposure time every shot of the N-th wafer.

In the aforementioned exposure method, the aforementioned light exposure decision step preferably includes a relational expression operation step of obtaining a relational expression of illuminance and an exposure time from illuminance measurement results obtained from the aforementioned illuminance measuring step and a first illuminance operation step of obtaining illuminance at the time of starting exposure of the N-th wafer and illuminance at the time of ending the exposure from the relational expression obtained in the aforementioned relational expression operation step.

In the aforementioned exposure method, the N-th wafer is preferably provided with a plurality of shot areas, and the aforementioned light exposure decision step preferably further includes a second illuminance operation step of obtaining illuminance every shot of the N-th wafer and an exposure time operation step of obtaining an exposure time every shot of the N-th wafer.

In the aforementioned exposure apparatus and the aforementioned exposure method, the exposure time can be correctly set with higher precision.

According to a further aspect of the present invention, an exposure apparatus setting a prescribed light exposure in exposure for forming a resist pattern comprises a dummy exposure unit performing dummy exposure after a lapse of a prescribed time from completion of an exposure step for a wafer to an exposure step for a next wafer.

According to a further aspect of the present invention, an exposure method setting a prescribed light exposure in exposure for forming a resist pattern comprises a dummy exposure step of performing dummy exposure after a lapse of a prescribed time from completion of an exposure step for a wafer to an exposure step for a next wafer.

According to the aforementioned exposure apparatus and the aforementioned exposure apparatus, a blur of the surface of an optical system resulting from contamination by various types of organic matter and inorganic matter is relaxed by a self-cleaning effect due to the dummy exposure, and the optical system can be prevented from a blur resulting from influence by environment.

According to a further aspect of the present invention, a semiconductor device is fabricated with an exposure method comprising an average illuminance operating step of operating average illuminance on the basis of measured illuminance values obtained from at least two illuminance meters provided on the emission side of a single optical system and a light exposure control step of controlling the light exposure on the basis of information obtained from the aforementioned average illuminance operating step.

According to a further aspect of the present invention, a semiconductor device is fabricated with an exposure method, setting a prescribed light exposure in exposure for forming a resist pattern, comprising an illuminance measuring step of performing illuminance measurement before exposing an (N–1)th (N: integer) wafer, illuminance measurement after exposing the (N–1)th wafer and illuminance measurement during at least single exposure of the (N–1)th wafer and a light exposure decision step of deciding illuminance for an N-th wafer from measurement results obtained from the aforementioned illuminance measuring step for deciding the light exposure for exposing the N-th wafer.

According to a further aspect of the present invention, a semiconductor device is fabricated with an exposure method, setting a prescribed light exposure in exposure for forming a resist pattern, comprising a dummy exposure step of performing dummy exposure after a lapse of a prescribed time from completion of an exposure step for a wafer to an exposure step for a next wafer.

In the aforementioned semiconductor device, the pattern is correctly formed on a resist film, whereby the yield can be improved in steps of fabricating the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of an exposure apparatus, an exposure method and a semiconductor device fabricated with the exposure method according to the present invention are now described with reference to the drawings.

(First Embodiment)

Figure 1:
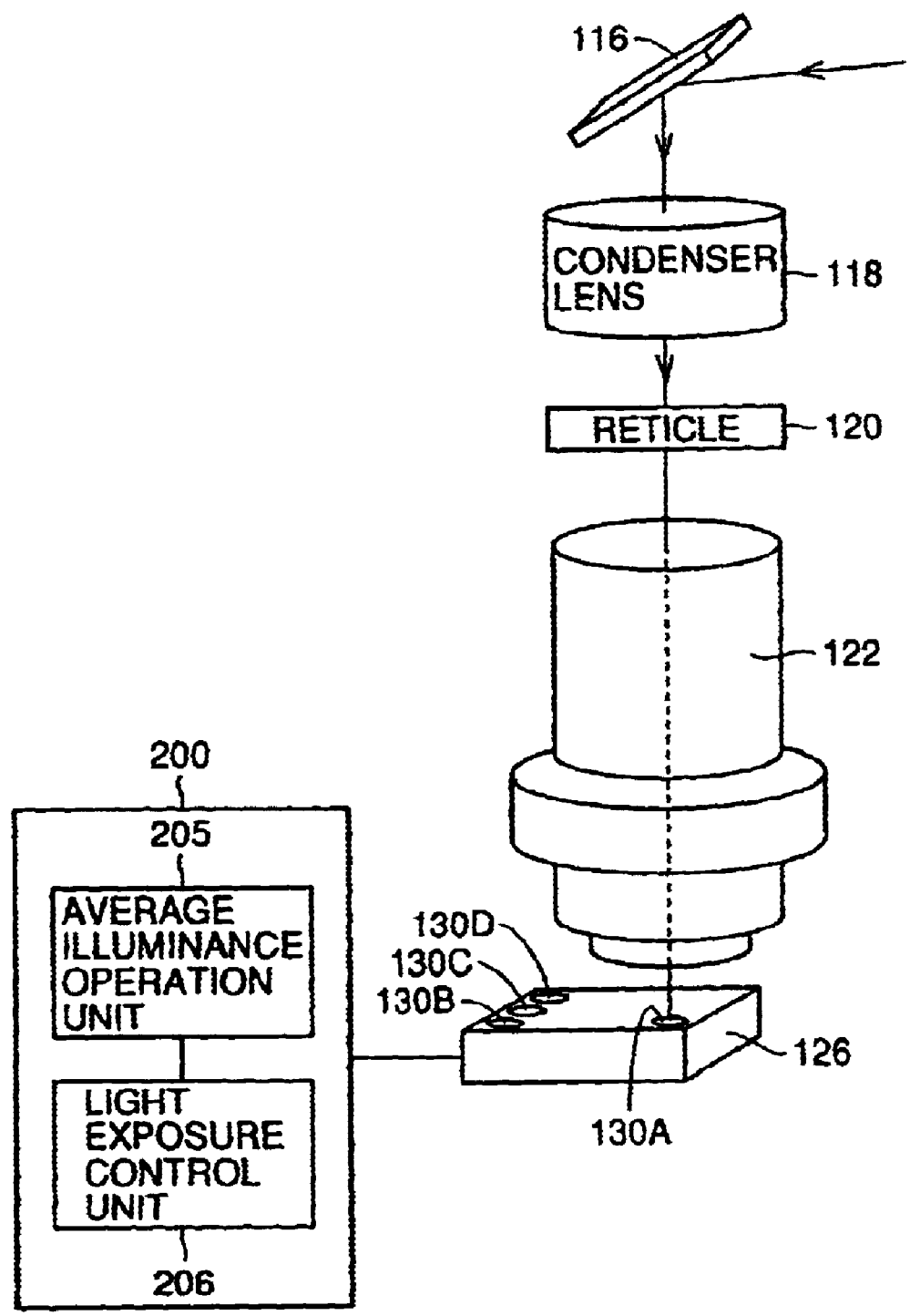
FIG. 1 is a model diagram schematically showing the structure of an exposure apparatus according to a first embodiment of the present invention.

An exposure apparatus, an exposure method and a semiconductor device fabricated with the exposure method according to a first embodiment of the present invention are described with reference to FIG. 1. FIG. 1 is a model diagram schematically showing the structure of the exposure apparatus according to the first embodiment.

(Structure of Exposure Apparatus)

Figure 8:
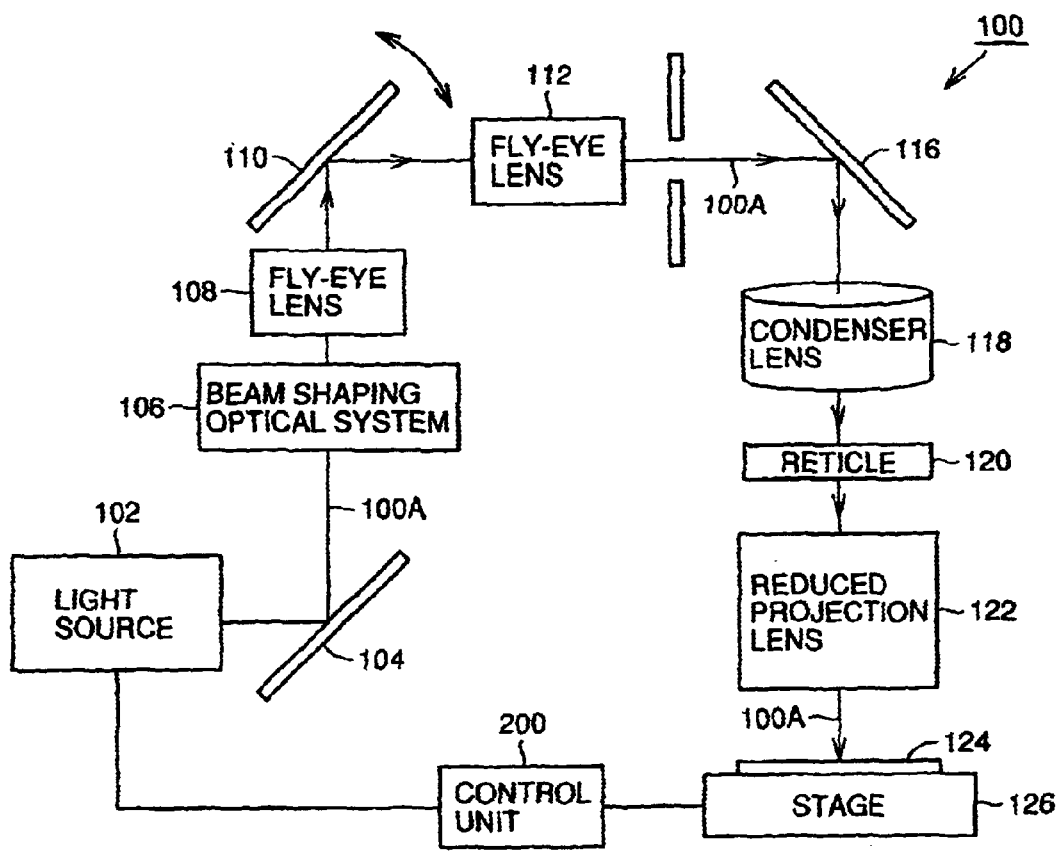
FIG. 8 illustrates the overall structure of a conventional exposure apparatus.
Figure 9:
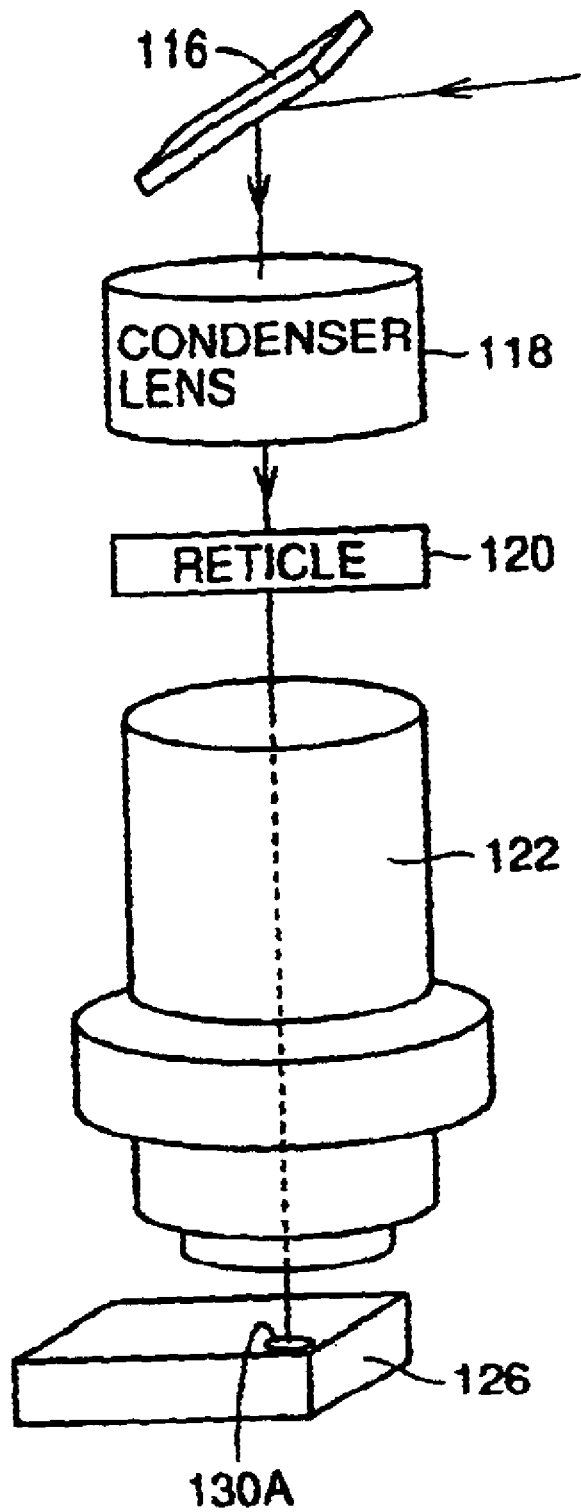
FIG. 9 schematically illustrates the structure of the conventional exposure apparatus.
Figure 10:
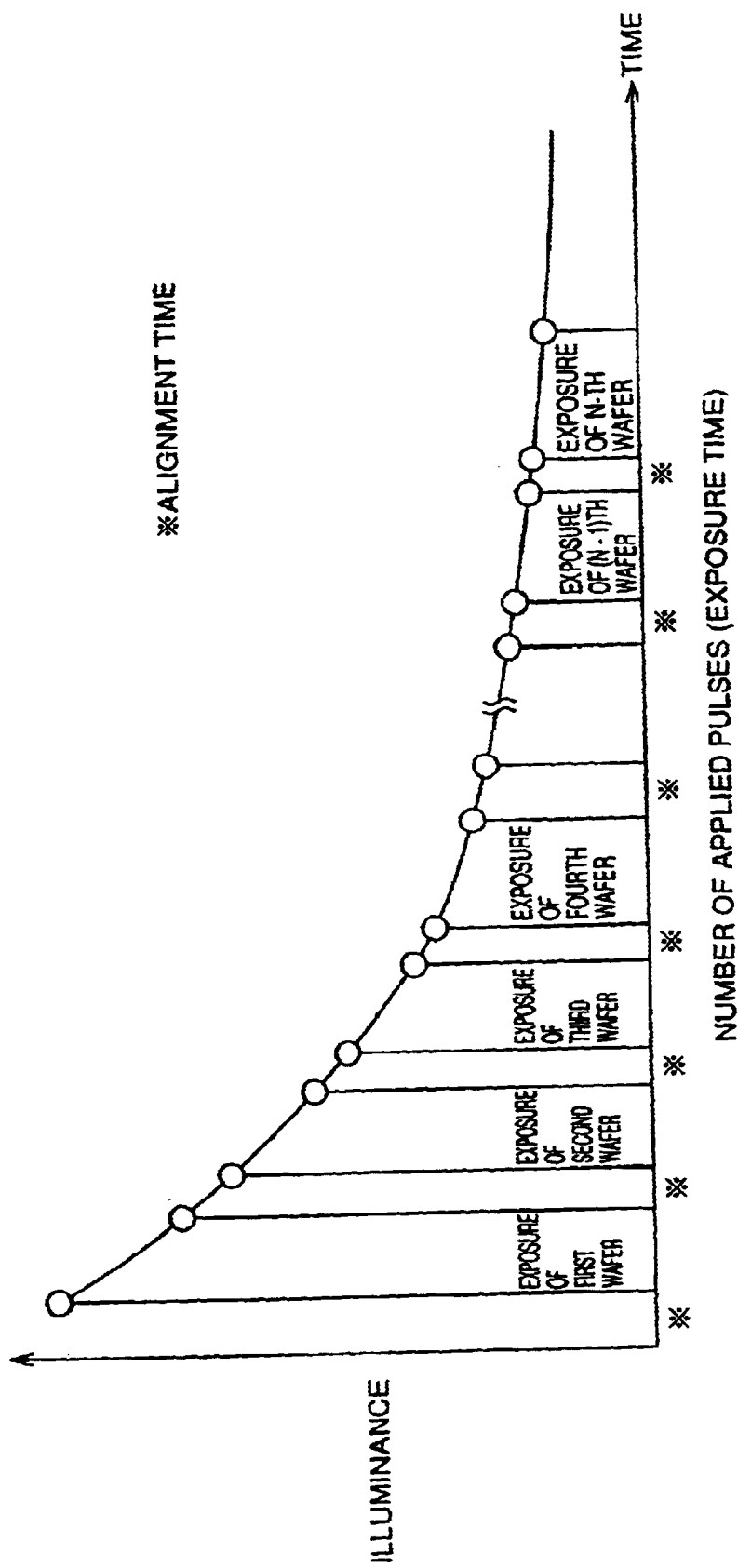
FIG. 10 illustrates the relation between illuminance and the number of applied pulses in the case of employing the conventional exposure apparatus.

First, the basic structure of the exposure apparatus according to this embodiment is identical to that of the exposure apparatus described with reference to FIGS. 8 and 9. The difference between the structure of the exposure apparatus according to this embodiment and that shown in FIGS. 8 and 9 resides in a point that four illuminance meters 130A. 130B, 130C and 130D are provided in the exposure apparatus according to this embodiment as shown in FIG. 1, while only the single illuminance meter 130A s provided on the stage 126 an the prior art. The number of the illuminance meters is not restricted to four but the illuminance meters can be provided in plural at need.

A control unit 200 is provided with an average illuminance operation unit 205 for averaging illuminance values obtained from the illuminance meters 130A to 130D and obtaining average illuminance and a light exposure control unit 206 controlling the light exposure on the basis of information obtained from the average illuminance operation unit 205. Other control units provided in the control unit 200 are not substantial parts of the present invention, and hence description thereof is omitted.

(Method of Correcting Light Exposure)

A method of correcting the light exposure in an exposure step for forming a pattern on a resist film with the exposure apparatus according to this embodiment is now described. First, illuminance on the emission side of a reduced projection lens is measured with the illuminance meters 130A, 130B, 130C and 130D before treating a wafer. Then, average illuminance is obtained with the average illuminance operation unit 205 from the illuminance values obtained from the illuminance meters 130A, 130B, 130C and 130D. Then, the exposure time is set on the basis of the average illuminance so that an integrated light exposure is regularly constant. In a step-and-repeat batch exposure system, for example, the exposure time is decided on the basis of the obtained average illuminance for controlling the integrated light exposure. In a scan exposure system, the scanning rate for an exposure stage is decided on the basis of the obtained average illuminance for controlling the integrated light exposure.

(Function/Effect)

According to the exposure apparatus and the exposure method of this embodiment, a plurality of illuminance meters are provided on an exposure stage located on the emission side of a reduced projection lens so that the average of obtained illuminance values can be obtained, whereby dispersion of measured values or the like is averaged and measuring accuracy for the illuminance can be improved.

When a prescribed threshold is provided for the measured values for obtaining the average illuminance except measured values exceeding the threshold, deterioration or abnormal values of the illuminance meters can be omitted so that the number of times of calibration of the illuminance meters provided on the emission side of the reduced projection lens of the exposure apparatus can be reduced as compared with the conventional exposure apparatus.

When fabricating a semiconductor device with the exposure apparatus and the exposure method according to this embodiment, a pattern can be correctly formed on a resist film and the yield can be improved in steps of fabricating the semiconductor device.

(Second Embodiment)

Figure 2:
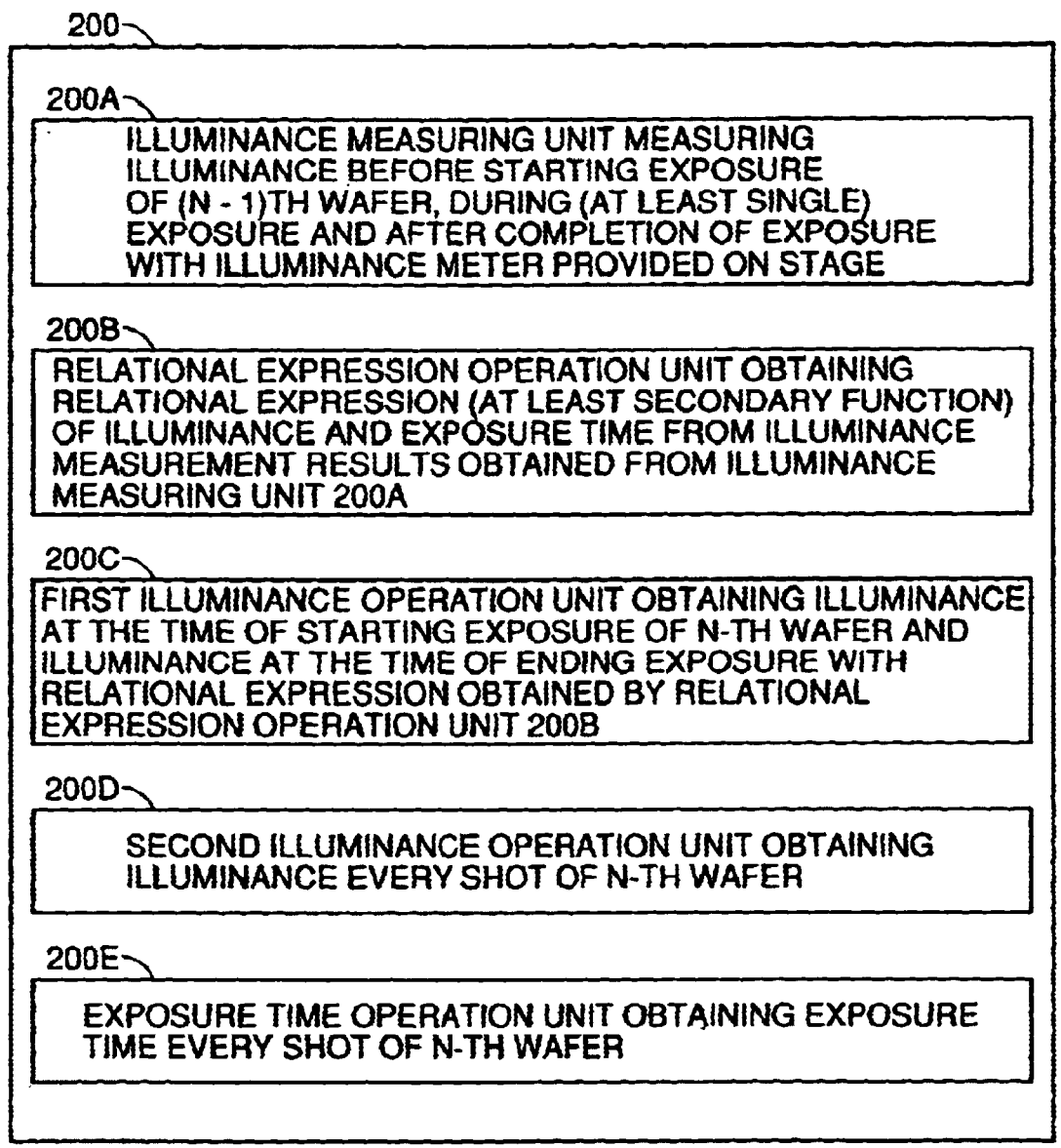
FIG. 2 is a block diagram showing a control unit of an exposure apparatus according to a second embodiment of the present invention.
Figure 3:
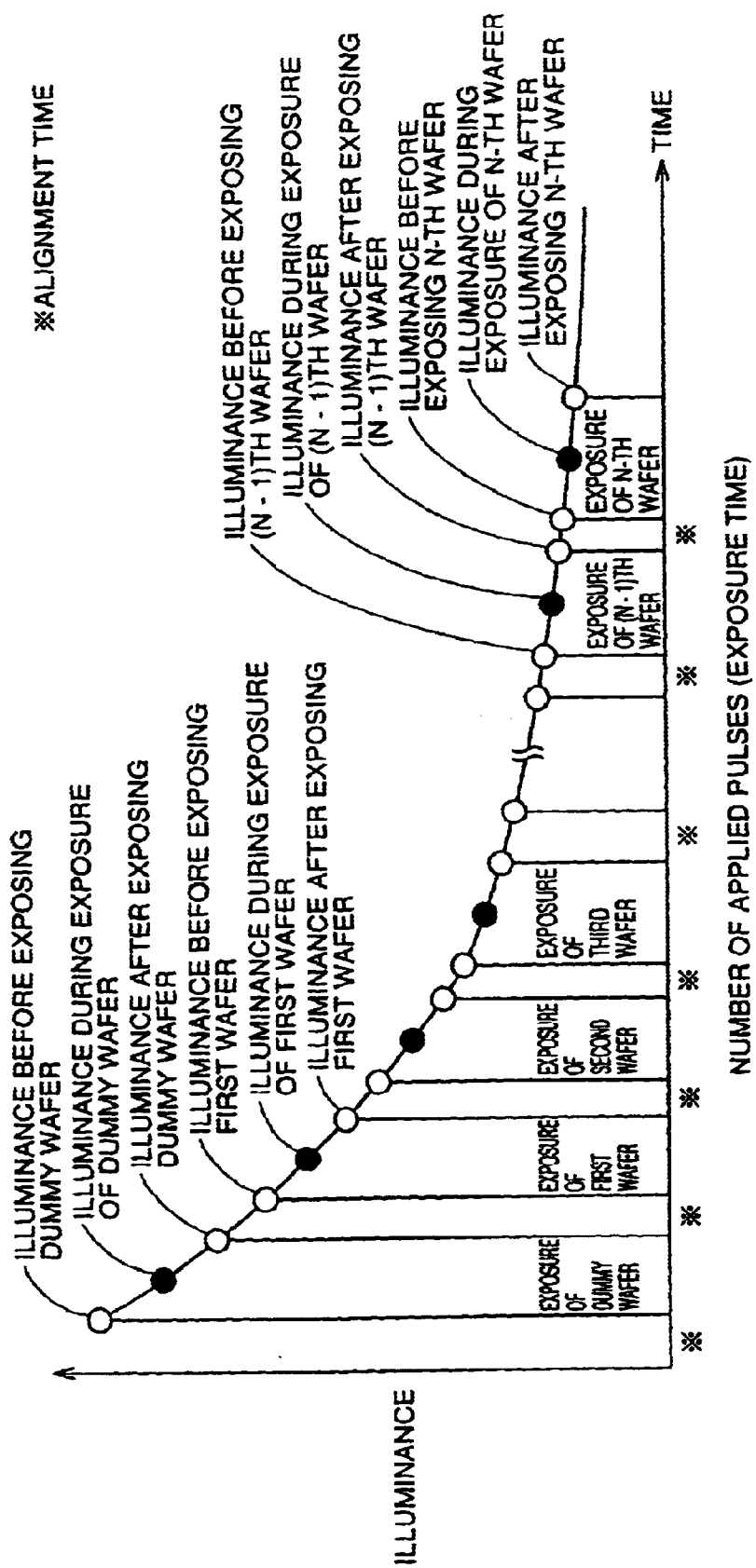
FIG. 3 illustrates the relation between illuminance and the number of applied pulses in the case of employing the exposure apparatus according to the second embodiment.
Figure 4:
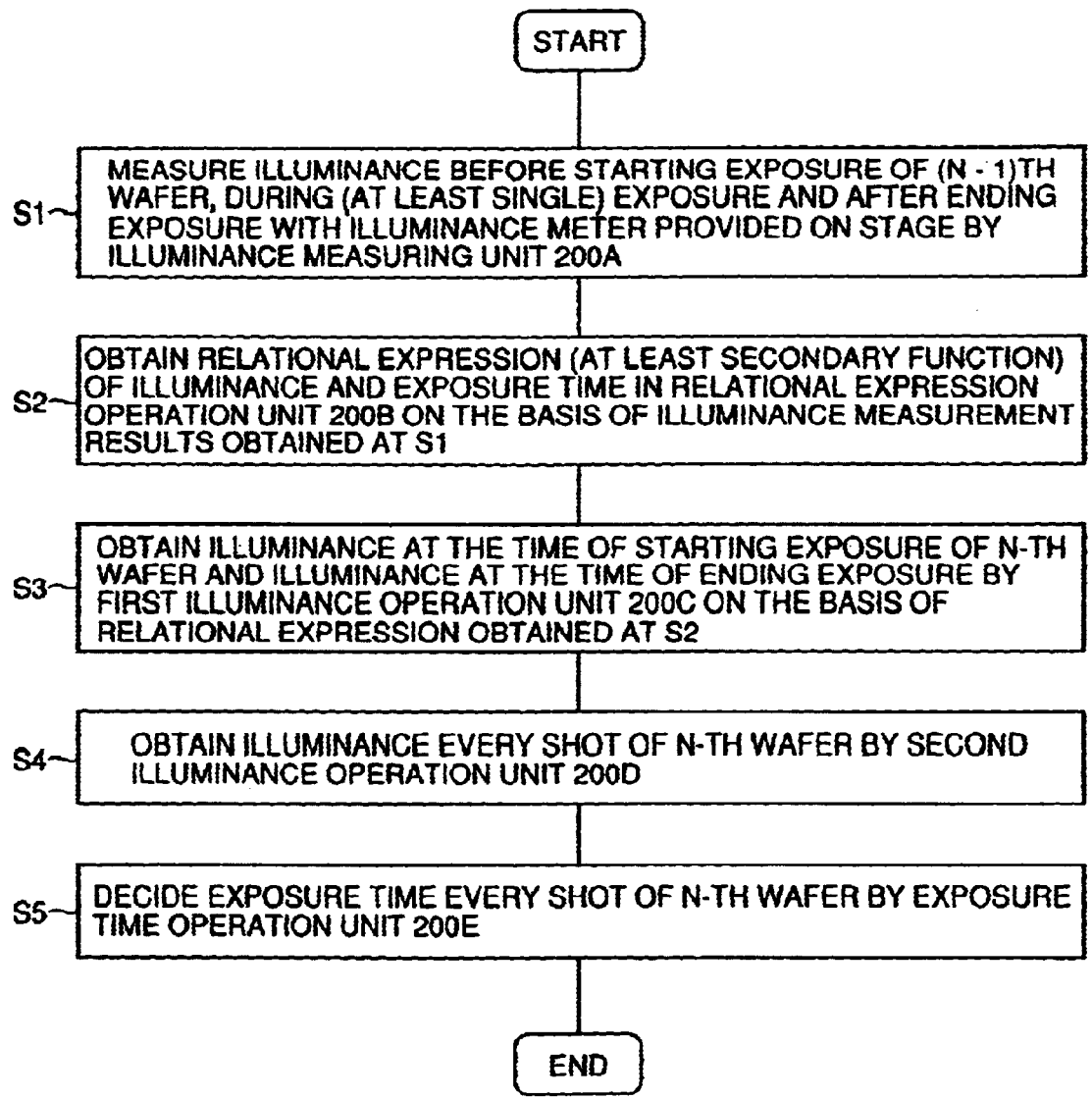
FIG. 4 is a flow chart showing a light exposure control method in the second embodiment.
Figure 5:
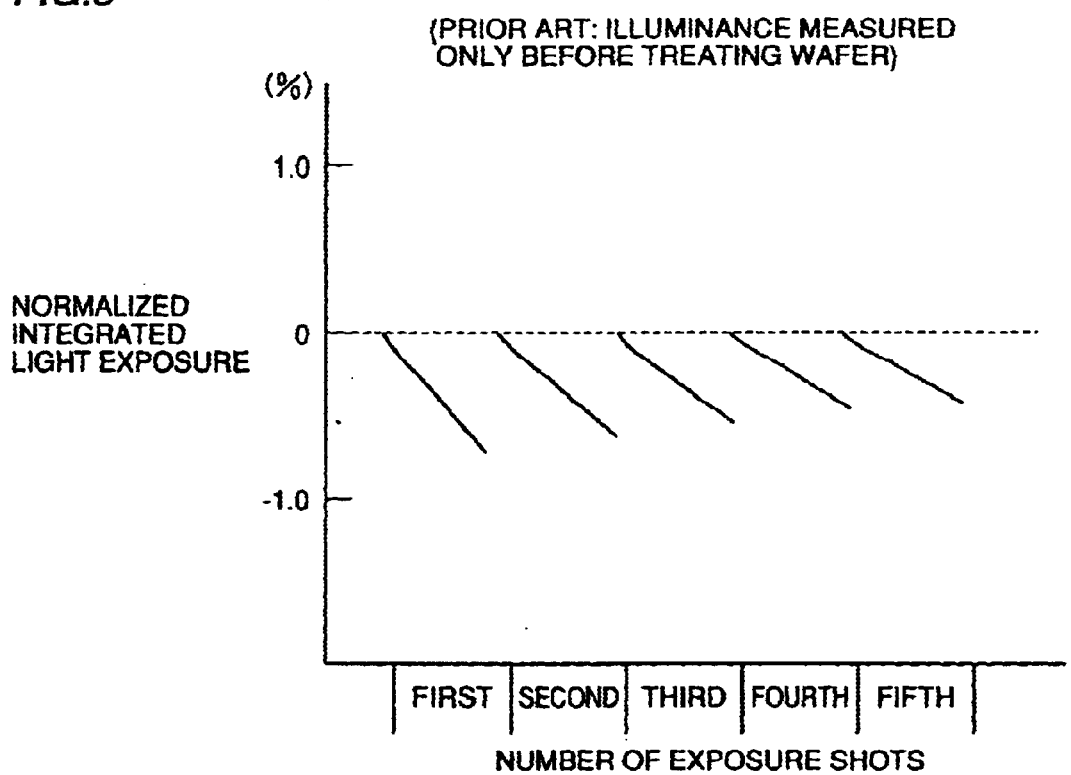
FIG. 5 illustrates a problem of a conventional exposure method.
Figure 6:
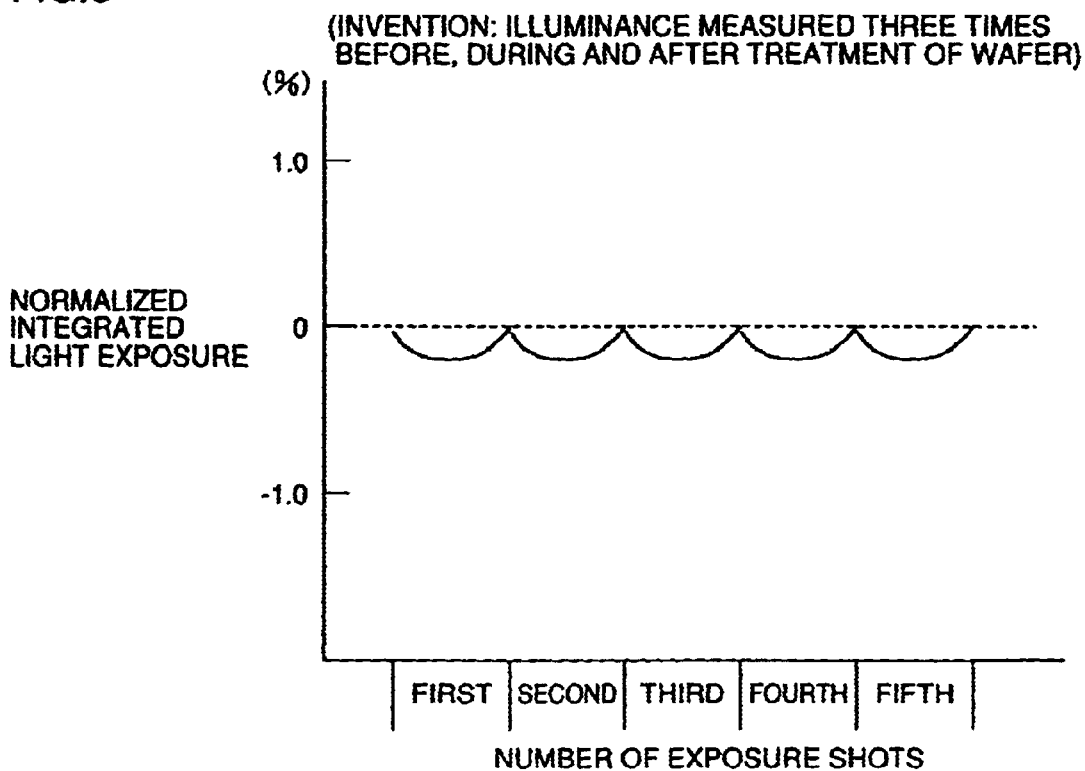
FIG. 6 illustrates an effect of the light exposure control method according to the second embodiment.

An exposure apparatus, an exposure method and a semiconductor device fabricated with the exposure method according to a second embodiment of the present invention are now described with reference to FIGS. 2 to 6. The feature of the exposure apparatus, the exposure method and the semiconductor device fabricated with the exposure method according to this embodiment resides in a control unit. FIG. 2 is a block diagram showing the control unit of the exposure apparatus according to this embodiment, FIG. 3 illustrates the relation between illuminance and the number of applied pulses in the exposure apparatus according to this embodiment, FIG. 4 is a flow chart showing a light exposure control method according to this embodiment, FIG. 5 illustrates a problem in a conventional exposure method, and FIG. 6 illustrates an effect of the light exposure control method according to this embodiment.

(Structure of Exposure Apparatus)

The structure of the exposure apparatus according to this embodiment is identical to that of the conventional exposure apparatus or the exposure apparatus according to the aforementioned first embodiment. As shown in the block diagram of FIG. 2, a control unit 200 of the exposure apparatus according to this embodiment includes an illuminance measuring unit 200A measuring illuminance before exposing an (N−1)th wafer, during (at least single) exposure and after ending exposure with an illuminance meter provided on a stage, a relational expression operation unit 200B obtaining a relational expression (at least a secondary function) of illuminance and an exposure time from results of illuminance measurement obtained from the illuminance measuring unit 200A, a first illuminance operation unit 200C obtaining illuminance at the time of starting exposure of an N-th wafer and illuminance at the time of ending the exposure with the relational expression obtained by the relational expression operation unit 200B, a second illuminance operation unit 200D obtaining illuminance every shot of the N-th wafer, and an exposure time operation unit 200E obtaining an exposure time every shot of the N-th wafer. The relational expression operation unit 200B, the first illuminance operation unit 200C, the second illuminance operation unit 200D and the exposure time operation unit 200E form a light exposure decision unit. Other control units provided in the control unit 200 are not substantial parts of the present invention, and hence description thereof is omitted.

(Light Exposure Control Method)

The light exposure control method employing the exposure apparatus comprising the aforementioned control unit 200 is now described with reference to FIGS. 3 to 6. The feature of the light exposure control method according to this embodiment resides in that illuminance measurement before and after exposing an (N−1)th wafer and illuminance measurement during exposure of the (N−1)th wafer (N=1, 2, 3, . . . ) are performed at least once as a method of deciding the light exposure for treating an N-th wafer in the exposure apparatus as shown in FIG. 3, for deciding illuminance for the N-th wafer on the basis of the results of measurement and controlling the light exposure for treating the N-th wafer.

FIG. 4 is a flow chart of the light exposure control method according to this embodiment. First, the illuminance measuring unit 200A measures illuminance before starting exposure of the (N−1)th wafer, during (at least single) exposure and after ending exposure with the illuminance meter provided on the stage at a step 1. At a step 2, the relational expression operation unit 200B obtains the relational expression (at least a secondary function) of the illuminance and the exposure time on the basis of the results of illuminance measurement obtained at the step S1. At a step S3, the first illuminance operation unit 200C obtains illuminance at the time of starting exposure of the N-th wafer and at the time of ending the exposure on the basis of the relational expression obtained at the step S2. At a step 4, the second illuminance operation unit 200D obtains illuminance every shot of the N-th wafer. At a step 5, the exposure time operation unit 200E decides the exposure time every shot of the N-th wafer. In the step-and-repeat batch exposure system, the exposure time operation unit 200E decides the exposure time from the obtained illuminance and controls the integrated light exposure. In the scan exposure system, the exposure time operation unit 200E decides the scanning rate for an exposure stage from the obtained illuminance and controls the integrated light exposure.

(Function/Effect)

The exposure time can be correctly set with high precision by deciding the exposure time every shot in the aforementioned manner also when illuminance on the emission side of a reduced projection lens is reduced following progress of the exposure time of the reduced projection lens due to a blur of the reduced projection lens (reduction of transmittance of the reduced projection lens resulting from solarization) as the wavelength employed for exposure is reduced, dissimilarly to the prior art.

FIGS. 5 and 6 show a problem in the prior art and an effect of this embodiment. Referring to each of FIGS. 5 and 6, the horizontal axis shows the number of exposure shots (corresponding to the number of treated wafers), and the vertical axis shows a normalized integrated light exposure (expressing dispersion (%) from a reference integrated light exposure). Referring to FIG. 5, reduction of the integrated light exposure is observed from the first one to the last one of the wafers when measuring illuminance only before treating the wafers. Referring to FIG. 6, it is understood that no reduction of the integrated light exposure is observed among the wafers but the integrated light exposure can be precisely controlled according to this embodiment.

When fabricating a semiconductor device with the exposure apparatus and the exposure method according to this embodiment, a pattern can be correctly formed on a resist film and the yield can be improved in steps of fabricating the semiconductor device.

(Third Embodiment)

While an optical system is blurred due to influence by environment (contamination by various types of organic matter, inorganic matter and the like), it is known that such a blur is relaxed by a self-cleaning effect (an effect of generating ozone by exposure and decomposing organic matter adhering to the optical system) due to exposure (when the surface of the optical system adsorbs contamination by various types of organic matter, inorganic matter and the like, dissimilarly to the blur (solarization) of the optical system described above), as shown in the following formulas (1) to (4):

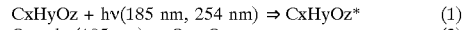
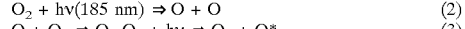
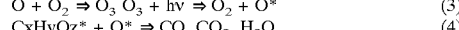
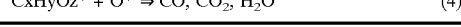

$$CxHyOz + h\nu(185\ nm, 254\ nm) \Rightarrow CxHyOz^* \quad (1)$$
$$O_2 + h\nu(185\ nm) \Rightarrow O + O \quad (2)$$
$$O + O_2 \Rightarrow O_3\ \ O_3 + h\nu \Rightarrow O_2 + O^* \quad (3)$$
$$CxHyOz^* + O^* \Rightarrow CO, CO_2, H_2O \quad (4)$$

The numerical formula (1) means an operation of activating organic matter (CxHyOz) adhering to a lens with an exposure beam (hν) of an exposure apparatus. The numerical formula (2) means that $O_2$ contained in the atmosphere is decomposed to O due to the exposure beam (hν) of the exposure apparatus. The numerical formula (3) means that the decomposed O is bonded with $O_2$ for forming ozone $O_3$ and the generated ozone $O_3$ is decomposed to $O_2$ and oxygen radicals $O^*$ by the exposure beam (hν) of the exposure apparatus. The numerical formula (4) means that the activated organic matter is decomposed to CO, $CO_2$ and $H_2O$ due to attack by the oxygen radicals $O^*$.

(Structure of Exposure Apparatus and Exposure Method)

Figure 7:
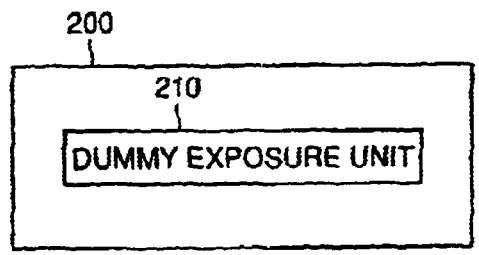
FIG. 7 is a block diagram showing a control unit of an exposure apparatus according to a third embodiment of the present invention.

According to a embodiment of the present invention, therefore, a control unit 200 is provided with a dummy exposure unit 210 automatically performing dummy exposure after a lapse of a certain constant time when no exposure is performed, as shown in FIG. 7. Other control units provided in the control unit 200 are not substantial parts of the present invention, and hence description thereof is omitted.

(Function/Effect)

Thus, an optical system can be prevented from a blur resulting from influence by environment. When fabricating a semiconductor device with an exposure apparatus and an exposure method according to this embodiment, a pattern can be correctly formed on a resist film and the yield can be improved in steps of fabricating the semiconductor device.

The structures and the exposure methods according to the aforementioned embodiments can be combined with each other at need.

According to an aspect of the exposure apparatus and the exposure method based on the present invention, the illuminance meters are so provided in plural that dispersion of measured values or the like is averaged and measurement accuracy for illuminance can be improved.

According to another aspect of the exposure apparatus and the exposure method based on the present invention, the exposure time can be correctly set with high precision by deciding the exposure time every shot also when illuminance on the emission side of the reduced projection lens is reduced following progress of the exposure time of the reduced projection lens due to a blur of the reduced projection lens (reduction of transmittance of the reduced projection lens resulting from solarization) as the wavelength employed for exposure is reduced, dissimilarly to the prior art.

According to still another aspect of the exposure apparatus and the exposure apparatus based on the present invention, a blur of the surface of the optical system resulting from contamination by various types of organic matter and inorganic matter is relaxed by a self-cleaning effect due to the dummy exposure, and the optical system can be prevented from a blur resulting from influence by environment.

According to the semiconductor device based on the present invention, the pattern is correctly formed on the resist film, whereby the yield can be improved in steps of fabricating the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposure apparatus setting a prescribed light exposure in exposure for forming a resist pattern with an optical system, comprising:

at least two spaced apart illuminance meters provided on the emission side of said optical system;

average illuminance operation means operating average illuminance on the basis of measured illuminance values obtained from said illuminance meters; and light exposure control means controlling the light exposure on the basis of information obtained from said average illuminance operation means.

2. The exposure apparatus according to claim 1, wherein said average illuminance operation means includes means obtaining said average illuminance with remaining said measured illuminance values except those of measured illuminance values exceeding a prescribed threshold in illuminance measurement.

3. An exposure apparatus setting a prescribed light exposure in exposure for forming a resist pattern, comprising:

illuminance measuring means performing illuminance measurement before exposing an (N−1)th (N: integer) wafer, illuminance measurement after exposing said (N−1)th wafer and illuminance measurement during at least single exposure of said (N−1)th wafer; and light exposure decision means deciding illuminance for an N-th wafer from measurement results obtained from said illuminance measuring means for deciding the light exposure for exposing said N-th wafer.

4. The exposure apparatus according to claim 3, wherein said light exposure decision means includes:

relational expression operation means obtaining a relational expression of illuminance and an exposure time from illuminance measurement results obtained from said illuminance measuring means, and first illuminance operation means obtaining illuminance at the time of starting exposure of said N-th wafer and illuminance at the time of ending said exposure from said relational expression obtained by said relational expression operation means.

5. The exposure apparatus according to claim 4, wherein said N-th wafer is provided with a plurality of shot areas, and said light exposure decision means further includes:

second illuminance operation means obtaining illuminance every shot of said N-th wafer, and exposure time operation means obtaining an exposure time every shot of said N-th wafer.

* * * * *